United States Patent
Urabe et al.

(10) Patent No.: US 7,531,904 B2
(45) Date of Patent: May 12, 2009

(54) AL-NI-B ALLOY WIRING MATERIAL AND ELEMENT STRUCTURE USING THE SAME

(75) Inventors: Hironari Urabe, Ageo (JP); Yoshinori Matsuura, Ageo (JP); Takashi Kubota, Omuta (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 11/666,300

(22) PCT Filed: Mar. 30, 2006

(86) PCT No.: PCT/JP2006/006676

§ 371 (c)(1),
(2), (4) Date: Apr. 25, 2007

(87) PCT Pub. No.: WO2006/117954

PCT Pub. Date: Nov. 9, 2006

(65) Prior Publication Data

US 2008/0001153 A1    Jan. 3, 2008

(30) Foreign Application Priority Data

Apr. 26, 2005 (JP) .............. 2005-128670
Aug. 30, 2005 (JP) .............. 2005-015697
Oct. 18, 2005 (JP) .............. 2005-302871
Oct. 18, 2005 (JP) .............. 2005-302900

(51) Int. Cl.
*H01L 23/48* (2006.01)

(52) U.S. Cl. .................. 257/771; 257/59; 257/72; 257/765; 257/E29.151; 148/502

(58) Field of Classification Search .............. 257/771, 257/E29.151
See application file for complete search history.

(56) References Cited

U.S. PATENT DOCUMENTS 6,096,438 A    8/2000   Takagi et al. .............. 428/472.2
6,329,275 B1   12/2001  Ishigami et al. .............. 438/584

(Continued)

FOREIGN PATENT DOCUMENTS

EP    0853136 A1    7/1998

(Continued)

OTHER PUBLICATIONS

Kusui et al. JP 07-224304 "Production of Boron-Containing Aluminum Alloy", Pubn-Date: Aug. 22, 1995, machine-translation by INPIT.*

(Continued)

*Primary Examiner*—Tu-Tu V Ho
(74) *Attorney, Agent, or Firm*—Roberts & Roberts LLP

(57) ABSTRACT

The present invention provides Al-based wiring material that allows, in a display device including thin film transistors and transparent electrode layers, direct bonding to the transparent electrode layer made of ITO, IZO or the like as well as direct bonding to the semiconductor layer, such as $n^{+}$-Si. The Al—Ni—B alloy wiring material according to the present invention is configured such that the nickel content X at %, the nickel atomic percent, and the boron content Y at %, the boron atomic percent, satisfy the following equations: $0.5 \leq X \leq 10.0$, $0.05 \leq Y \leq 11.0$, $Y+0.25X \geq 1.0$ and $Y+1.15X \leq 11.5$, and the remainder is aluminum.

20 Claims, 3 Drawing Sheets

U.S. PATENT DOCUMENTS

| | | | |
|---|---|---|---|
| 7,098,539 B2 * | 8/2006 | Gotoh et al. | 257/765 |
| 2004/0022664 A1 | 2/2004 | Kubota et al. | 420/550 |

FOREIGN PATENT DOCUMENTS

| | | | |
|---|---|---|---|
| EP | 0855451 A1 | 7/1998 |
| JP | 51-040313 A | 4/1976 |
| JP | 51-40313 A | 4/1976 |
| JP | 04-333566 A | 11/1992 |
| JP | 07-224304 | 8/1995 |
| JP | 10-018028 A | 1/1998 |
| JP | 10-183337 A | 7/1998 |
| JP | 11-003873 A | 1/1999 |
| JP | 2000-294556 A | 10/2000 |
| JP | 2001-53024 A | 2/2001 |
| JP | 2001-125123 A | 5/2001 |
| JP | 2003-089864 | 3/2003 |
| JP | 2003-89864 A | 3/2003 |
| JP | 2004-214606 | 7/2004 |
| JP | 2004-260194 A | 9/2004 |
| JP | 2005-290422 | 10/2005 |
| WO | WO97/13885 A1 | 4/1997 |
| WO | WO98/01598 A1 | 1/1998 |
| WO | WO03/029510 A1 | 4/2003 |

OTHER PUBLICATIONS

Aluminum (US aluminum). (2004). In The New Penguin Dictionary of Science. London: Penguin. Retrieved Sep. 2, 2008, from http://www.credoreference.com/entry/7457926/.* http://www.aluminum.org/AM/Template.cfm?Section=Overview&Template=/CM/HTMLDisplay.cfm&ContentID=26509.*

Kato, Kinya, et al. "Hillock-Free Aluminum-Based Alloy Interconnections for Active-Matrix Liquid Crystal Displays." IEICE Trans. Electron., vol. E80-C, No. 2. Feb. 1997, pp. 320-326.

Van Bakel, G.P.E.M., et al. "On the Structure and Chemistry of Ni3Al On An Atomic Scale Via Atom-Probe Field-Ion Microscopy." Applied Surface Science 90 (1995), pp. 95-105. XP-002477911, Japan.

* cited by examiner

Fig. 1
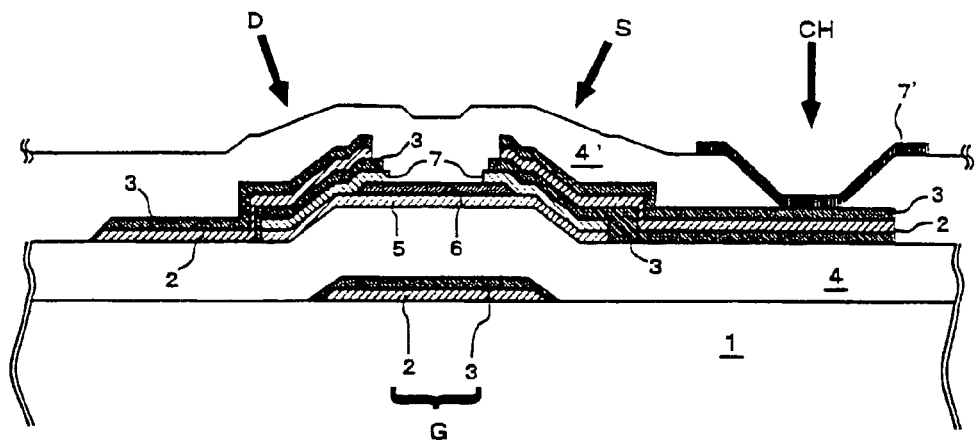
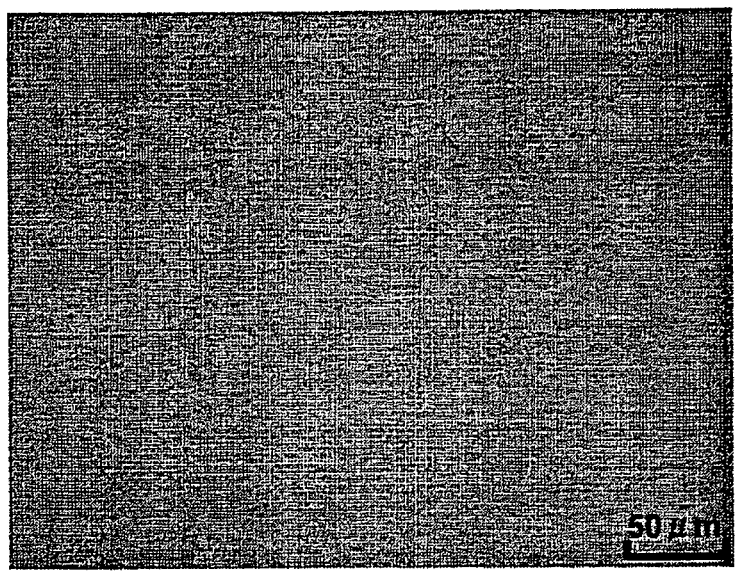
Fig. 2
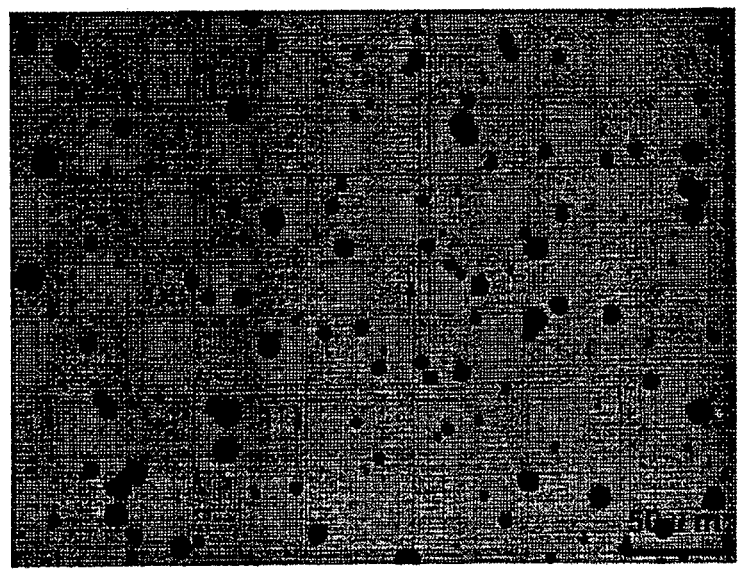
Fig. 3

US 7,531,904 B2

AL-NI-B ALLOY WIRING MATERIAL AND ELEMENT STRUCTURE USING THE SAME

TECHNICAL FIELD

The present invention relates to Al-based alloy wiring material used for elements in a display device, such as a liquid crystal display, and particularly to Al—Ni—B alloy wiring material suitable for a display device having thin film transistors and transparent electrodes and an element structure using the Al—Ni—B alloy wiring material.

BACKGROUND ART

In recent years, in a display device, such as a thin television represented by a liquid crystal display, aluminum-based alloy wiring material (in some cases, aluminum is hereinafter simply referred to as Al) is widely used as constituent material of the display device, because Al-based alloy wiring material has low specific resistance value and is easy to perform a wiring process.

For example, in an active matrix liquid crystal display, each element is formed of a thin film transistor (hereinafter abbreviated to a TFT) as a switching element, a transparent electrode (in some cases, hereinafter referred to as a transparent electrode layer) made of ITO (Indium Tin Oxide) or IZO (Indium Zinc Oxide), and a wiring circuit made of Al-based alloy wiring material (in some cases, hereinafter referred to as a wiring circuit layer). Such an element structure has a portion where the wiring circuit made of Al-based alloy wiring material is bonded to the transparent electrode and a portion where the wiring circuit is bonded to n$^+$-Si (phosphorus-doped semiconductor layer) in the TFT.

When the element described above is formed using Al-based alloy wiring material presently used, refractory metal material, such as molybdenum (Mo) and titanium (Ti), is formed between the wiring circuit and the transparent electrode as a so-called cap layer, considering the effect of aluminum oxide formed in the Al-based alloy wiring material. Similarly, when a semiconductor layer, such as n$^+$-Si, and the wiring circuit are bonded to each other, in order to prevent interdiffusion of Al and Si caused by a thermal operation in the manufacturing process, refractory metal material, such as molybdenum (Mo) and titanium (Ti) as in the cap layer, is interposed between the semiconductor layer and the wiring circuit.

The above element structure will be specifically described with reference to FIG. 1. FIG. 1 is a schematic cross-sectional view of an a-Si type TFT for a liquid crystal display. In the TFT structure, an electrode wiring circuit layer 2 made of Al-based alloy wiring material and a cap layer 3 made of Mo, Mo—W or the like, which together form a gate electrode section G, are formed on a glass substrate 1. To protect the gate electrode section G, a SiNx gate insulating film 4 is provided thereon. On the gate insulating film 4 are sequentially deposited an a-Si semiconductor layer 5, a channel protective film layer 6, an n$^+$-Si semiconductor layer 7, the cap layer 3, the electrode wiring circuit layer 2 and the cap layer 3, which are patterned as appropriate to provide a drain electrode section D and a source electrode section S. The drain electrode section D and the source electrode section S are coated with a resin or SiNx insulating film 4' for planarizing the surface of the element. Furthermore, on the source electrode section S side, a contact hole CH is provided in the insulating layer 4', where a transparent electrode layer 7' made of ITO or IZO is formed. When such an electrode wiring circuit layer 2 is made of the Al-based alloy wiring material, the cap layers 3 are interposed between the n$^+$-Si semiconductor layer 7 and the electrode wiring layer 2 as well as between the transparent electrode layer 7' and the electrode wiring layer 2 in the contact hole CH.

In the element structure shown in FIG. 1, formation of the cap layer made of Mo or the like forces additional cost for material, manufacturing equipment and the like, and its complicated manufacturing process has been pointed out. To address these problems, the applicant has already proposed a technology that allows the cap layers in such a conventional element structure to be eliminated (see Japanese Patent Application Laid-Open No. 2003-89864). Japanese Patent Application Laid-Open No. 2003-89864 discloses Al—C—Ni alloy and Al—C—Ni—Si alloy wiring materials, to which ITO can be directly bonded.

DISCLOSURE OF THE INVENTION

Problems to be Solved by the Invention

The Al-based alloy wiring material disclosed in Japanese Patent Application Laid-Open No. 2003-89864 can be directly bonded to the transparent electrode layer made of ITO, IZO or the like, but does not have sufficiently satisfactory characteristic for direct bonding to the semiconductor layer, such as n$^+$-Si. For example, when the wiring circuit layer made of the Al-based alloy wiring material is directly bonded to the semiconductor layer, Al and Si diffuse across the bonded interface, exhibiting a tendency of bonding characteristic to be unsatisfactory in some cases.

More specifically, to eliminate the cap layers in the element structure shown in FIG. 1, Al-based alloy wiring material that satisfies the following characteristics is required. The electrode wiring circuit layer 2 of the gate electrode G in the element structure shown in FIG. 1 needs to allow direct bonding to a transparent electrode layer made of ITO or the like at an extended wiring portion (not shown), and requires to have heat resistance of desirably at least 350° C., because such heat resistance is required to prevent defects, such as hillocks, in the electrode wiring circuit layer even at a temperature of 350° C. or higher when a high-temperature thermal history resulting from the formation of the gate insulating film on the gate electrode G is applied. On the other hand, the electrode wiring circuit layer 2 of the drain electrode section D and the source electrode section S in the element structure shown in FIG. 1 needs to allow direct bonding to the transparent electrode layer made of ITO or the like and direct bonding to the semiconductor layer, such as n$^+$-Si. The requirement for the direct bonding to the semiconductor layer, such as n$^+$-Si, is that Al and Si will not diffuse into each other under a thermal history of 200° C. or higher. Furthermore, the electrode wiring circuit layer 2 of the drain electrode section D and the source electrode section S requires heat resistance that prevents generation of defects, such as hillocks, under a thermal history of on the order of 250° C. Moreover, the Al-based alloy wiring material that forms the gate electrode section G, the drain electrode section D, the source electrode section S and other wiring portions naturally requires a low specific resistance characteristic, that is, a specific resistance value of 10 μΩ-cm or lower, desirably 5 μΩ-cm or lower. That is, there is a strong need for Al-based alloy wiring material that meets all the above requirement characteristics.

In conventional Al-based alloy wiring material, it is inferred that precipitate, such as intermetallic compounds, is present in the wiring circuit and such precipitate allows direct bonding to the transparent electrode layer (pixel electrode) (see Japanese Patent Application Laid-Open No. 2004-

214606, for example). However, as far as the present inventors know, it has not been clearly understood what dispersion state of the precipitate in the wiring circuit made of the Al-based alloy wiring material will affect the direct bonding. Thus, to achieve more ideal direct bonding, there is a need for further understanding of the phenomenon associated with the precipitate in the Al-based alloy wiring material.

It has been known that when the conventional Al-based alloy wiring material is used to form a wiring circuit, the surface of the sputtered Al-based alloy film becomes significantly rough. Directly laminating a transparent electrode layer, a semiconductor layer or the like on the Al-based alloy film under such a rough surface condition presents a concern for unsatisfactory coverage of the rough surface with the laminated material, that is, incomplete coating of depressions of the surface irregularities with the laminated material. Thus, there is a need for further investigation of the technology for smoothing the surface of the Al-based alloy film that forms the wiring circuit.

The present invention has been made in view of the above circumstances and aims to provide Al-based alloy wiring material that is used in a display device having thin film transistors and transparent electrode layers and can be directly bonded to a transparent electrode layer made of ITO, IZO or the like as well as a semiconductor layer, such as $n^+$-Si. In the elements of a display device having a structure in which a wiring circuit layer made of the Al-based alloy wiring material is directly bonded to the transparent electrode layer or the semiconductor layer, the present invention also proposes an element structure of the display element that prevents increased contact resistance due to the direct bonding and bonding failure.

Means for Solving the Problems

The present inventors have conducted extensive investigation on Al—Ni-based alloys and found that the above problems can be solved by using an Al—Ni-based alloy containing a predetermined amount of boron (B). Thus, the present inventors have attained the present invention.

According to the present invention, there is provided Al—Ni—B alloy wiring material made of aluminum containing nickel and boron. The nickel content X at %, the nickel atomic percent, and the boron content Y at %, the boron atomic percent, satisfy the following equations:

$$0.5 \leq X \leq 10.0 \quad (1)$$

$$0.05 \leq Y \leq 11.0 \quad (2)$$

$$Y + 0.25X \geq 1.0 \quad (3)$$

$$Y + 1.15X \leq 11.5 \quad (4)$$

and the remainder is aluminum. The Al—Ni—B alloy wiring material of the present invention does not exclude possible inclusion of gas components and other inevitable impurities in the material manufacturing process, the wiring circuit formation process, the element manufacturing process and the like within a scope not departing from the advantages provided by the present invention described below.

Nickel and aluminum form intermetallic compounds in a heat treatment process, and such intermetallic compounds provide a satisfactory bonding characteristic in direct bonding to a transparent electrode layer. However, higher nickel content will increase the specific resistance of a wiring circuit itself, rendering the wiring circuit impractical. On the other hand, lower nickel content will reduce the amount of the aluminum-nickel intermetallic compound production, preventing direct bonding to the transparent electrode layer and resulting in a tendency of reduced heat resistance (preventive effect on plastic deformation of Al-based alloy wiring material due to heat). Thus, the nickel content needs to satisfy the above equation (1).

Specifically, when the nickel content exceeds 10.0 at %, the specific resistance value of the wiring material becomes too high and dished defects called dimples are likely formed on the wiring material surface, exhibiting a tendency of unsatisfactory heat resistance. When the nickel content is lower than 0.5 at %, projections, so-called hillocks, are likely formed on the wiring material surface, exhibiting a tendency of unsatisfactory heat resistance. The dimple refers to a tiny dished defect formed on the material surface resulting from the stress and strain generated when the Al-based alloy wiring material undergoes heat treatment. Such dimples will adversely affect the bonding characteristic and reduce the bonding reliability. On the other hand, the hillock is, in contrast to the dimple, a projection formed on the material surface resulting from the stress and strain generated when the Al-based alloy wiring material undergoes heat treatment. Again, such hillocks will adversely affect the bonding characteristic and reduce the bonding reliability. These dimples and hillocks are common in that they are caused by plastic deformation of Al-based alloy wiring material due to heat and phenomena collectively called stress migration. The heat resistance of Al-based alloy wiring material can be judged in terms of the occurrence level of these defects.

Inclusion of boron as well as nickel in aluminum according to the present invention provides an advantage of effectively preventing interdiffusion of Al and Si across the bonded interface when directly bonded to a semiconductor layer, such as $n^+$-Si. Furthermore, boron benefits the heat resistance as nickel does. When the boron content exceeds 11.00 at %, the specific resistance of the wiring circuit itself increases, rendering the wiring circuit impractical. On the other hand, when the boron content is lower than 0.05 at %, the capability to prevent the interdiffusion of Al and Si will be reduced, which will not allow direct bonding to the semiconductor layer. Specifically, when the semiconductor layer and the Al—Ni—B alloy wiring material are directly bonded and undergo heat treatment at a predetermined temperature, interdiffusion of Al and Si will likely to occur across the bonded portion. Furthermore, the dimples likely tend to be generated. Thus, the boron content needs to satisfy the above equation (2).

The present inventors have also found that the equation (3) needs to be satisfied in order to reliably prevent the interdiffusion of Al and Si across the bonded interface in a thermal operation at a temperature of 240° C. or higher after directly boded to the semiconductor layer. The present inventors have also found that the above equation (4) needs to be satisfied in order to reliably maintain the specific resistance of the Al—Ni—B alloy wiring material itself to be 10 μΩ-cm or lower.

Furthermore, within the range that satisfies the above equations (1) to (4), when the nickel content is 4.0 at % or higher and the boron content is 0.80 at % or lower, there is obtained Al—Ni—B alloy wiring material that will generate substantially fewer dimples as described above, providing improved bonding reliability when directly bonded to the semiconductor layer or the transparent electrode layer. More specifically, when heat treatment at 350° C. for 30 minutes is carried out, the occurrence rate of the dimples generated on the surface of the Al—Ni—B alloy wiring material can be reduced to 1.6% or lower, providing more preferable Al—Ni—B alloy wiring material.

As described above, the dimple is a tiny dished defect formed on the Al—Ni—B alloy wiring material surface when the wiring material undergoes heat treatment. The present inventors have performed a predetermined heat treatment on the Al—Ni—B alloy wiring material and observed the surface of the material to investigate the generated dimples (0.3 to 0.5 μm). In this dimple investigation, the total area of the dimples in the observational field of view were calculated and the ratio of the total dimple area to the observational field of view was defined as the dimple occurrence rate, which was used to investigate the heat resistance characteristic of the wiring material. As a result, the present inventors have found that, within the range that satisfies the above equations (1) to (4), when the nickel content is 4.0 at % or higher and the boron content is 0.80 at % or lower, the dimple occurrence rate can be reduced to 1.6% or lower even when the wiring material undergoes heat treatment at 350° C. for 30 minutes. The occurrence of such dimples is desirably suppressed to the lowest possible level, and when the dimple occurrence rate is low, the wiring material that has undergone a thermal operation in the element manufacturing process of the display device will not likely generate bonding defects and the like at the bonded interface where the semiconductor layer or the transparent electrode layer has been directly bonded, resulting in improved bonding reliability and providing more preferable wiring material. When the dimple occurrence rate is lower than or equal to 1.6%, it is considered that, for example, the on/off ratio of the TFT having a structure to which the semiconductor layer is directly bonded becomes stable, resulting in improved connection reliability. Although the Al—Ni—B alloy wiring material according to the present invention is suitable for being directly bonded to the semiconductor layer or the transparent electrode layer, it is not intended to exclude, for example, the case where the Al—Ni—B alloy wiring material is applied to an element structure provided with the cap layer made of refractory metal material, such as Mo, on the semiconductor layer side. Furthermore, the Al—Ni—B alloy wiring material according to the present invention can be applied as a so-called reflective film to other applications different from the direst bonding of the semiconductor layer or the transparent electrode layer as described above.

Moreover, the present inventors have found that within the range that satisfies the above equations (1) to (4), when the nickel content is 4.0 at % to 6.0 at % and the boron content is 0.20 at % to 0.80 at %, there is provided Al—Ni—B alloy wiring material particularly suitable for being directly bonded to the semiconductor layer.

Although it has been known that directly bonding a wiring circuit layer made of Al-based alloy wiring material to a semiconductor layer results in interdiffusion of Al and Si across the bonded interface, the study conducted by the present inventors has confirmed that this interdiffusion serves to form an altered layer at the bonded interface created by the direct bonding. This altered layer refers to a black-dotted altered portion viewed on the surface of the semiconductor layer or the state of the discolored or roughened surface of the semiconductor layer when observing the surface of the semiconductor layer obtained by directly bonding the Al-based alloy wiring material to the semiconductor layer, performing a predetermined heat treatment thereon, and then stripping the Al-based alloy wiring material (such a surface of the semiconductor layer is herein referred to as an altered layer). Such an altered layer tends to be more likely generated as the heat treatment temperatures are higher, and it is practically desirable that such an altered layer will not be generated in heat treatment at 200° C. or higher (for 30 minutes). Taking into account a thermal history applied when the insulating film is formed by CVD, it is desirable that such an altered layer will not be generated at high temperatures ranging from 240° C. to 300° C. Furthermore, to provide a margin of applicability of a manufacturing condition in which thermal histories are applied in the element manufacturing process, it is considered desirable that such an altered layer will not be generated at temperatures of 330° C. and higher. The present inventors have conducted a study to find a composition range that will not generate such an altered layer and found that within the range that satisfies the above equations (1) to (4), when the nickel content is 4.0 at % to 6.0 at % and the boron content is 0.20 at % to 0.80 at %, the formation of the altered layer tends to be suppressed even in heat treatment at 330° C. for 30 minutes. In this composition range, the specific resistance value of the wiring material itself becomes 5 μΩ-cm or lower. That is, within this composition range, the generation of the dimples is significantly suppressed as described above and the specific resistance value is lowered, resulting in significantly preferable Al—Ni—B alloy wiring material for practical use to achieve direct bonding to the semiconductor layer.

The present inventors have also investigated the change in the surface state of the semiconductor layer. This investigation was conducted, after direct bonding, heat treatment and stripping of the Al-based alloy wiring material, by comparing the surface roughness Rz (ten-point mean roughness, JIS B0601: 1994) of the exposed semiconductor layer with the surface roughness Rz of the semiconductor layer prior to the direct bonding. From the result of the investigation on the change in the surface state, the present inventors have further found that within the range that satisfies the above equations (1) to (4), when the Al-alloy wiring material of the present invention is composed such that the nickel content is 4.0 at % to 6.0 at % and the boron content is 0.20 at % to 0.80 at %, the amount of change in the surface roughness value of the directly bonded, heat treated and exposed semiconductor layer can be 1.5 or lower when the surface roughness value of the semiconductor layer prior to the direct bonding is assumed 1.

Although it has not been clearly known if the amount of change in the surface roughness of the semiconductor layer is a parameter directly associated with the interdiffusion of Si and Al, it has been confirmed that the amount of change increases as the temperature of the heat treatment increases. It is also anticipated that the change in the surface state of the semiconductor layer will affect the switching characteristic of the TFT. That is, it is predicted that this change leads to the change in the on-off ratio of the TFT, and it is anticipated that less change in the surface state of the semiconductor layer after the direct bonding to the semiconductor layer and the heat treatment may well maintain the switching characteristic of the transistor. Thus, it is considered that the fact that the amount of change in the surface roughness Rz of the exposed semiconductor layer after direct bonding, heat treatment and stripping of the Al-based alloy wiring material is 1.5 or lower when the surface roughness value of the semiconductor layer prior to the direct bonding is assumed 1 will sufficiently ensure connection reliability taking into account the switching characteristic of the TFT and the like. Although in the present invention, the surface roughness Rz is used to identify the surface state when the surface state of the semiconductor layer changes upon the direct bonding, it is also possible to use a surface property parameter set forth in JIS B0601 and the like, for example, surface roughness Ra (arithmetic mean roughness).

In the element structure of the display device having a structure in which Al-based alloy wiring material is directly bonded to a transparent electrode layer and a semiconductor layer, the present inventors conducted a study on the surface roughness Ra of the Al-based alloy film as a factor causing increased contact resistance and bonding failure upon direct bonding, and found that the surface roughness Ra of the Al—Ni—B alloy film made of the Al—Ni—B alloy wiring material that forms the wiring circuit to which the semiconductor layer and/or the transparent electrode layer is directly bonded is desirably 2.0 Å to 20.0 Å. A strong tendency has been observed that when the surface roughness Ra of the Al—Ni—B alloy film made of the Al-based alloy wiring material according to the present invention is smaller than 2.0 Å, the bonding strength decreases when the transparent electrode layer is directly bonded, while when the surface roughness Ra is greater than 20.0 Å, the contact resistance increases. In this description, the surface roughness Ra refers to the roughness of the surface of the deposited Al—Ni—B alloy film. Depending on the method for manufacturing the display device, a semiconductor layer will be further deposited on the deposited Al—Ni—B alloy film when the structure is the staggered type, while a transparent electrode layer will be further deposited on the deposited Al—Ni—B alloy film when the structure is the reverse staggered type. The surface roughness Ra is measured in a noncontact manner using an atomic force microscope (AFM) and calculated in accordance with JIS B0601-1982.

The Al—Ni—B alloy film made of the Al—Ni—B alloy wiring material according to the present invention desirably has a thickness of 1000 Å to 3000 Å, because there is a tendency that when the thickness of the Al—Ni—B alloy film is smaller than 1000 Å, it is difficult to obtain practically acceptable effective resistance when a wiring circuit is formed, while when the thickness is greater than 3000 Å, the coverage of the Al—Ni—B alloy film with the overlying laminated layer becomes nonuniform so that it is difficult to form a practical element structure.

Furthermore, according to the study conducted by the present inventors, it has been found that in the wiring circuit layer made of the Al—Ni—B alloy wiring material according to the present invention, precipitate that is dispersedly precipitated in the wiring circuit layer upon the formation of the element is uniformly dispersed without segregation.

In the study conducted by the present inventors, it has been confirmed that in a specific composition of Al-based alloy wiring material conventionally proposed, compounds precipitated in the wiring circuit, that is, so-called intermetallic compounds tend to segregate. For example, in the Al—Ni—Nd alloy wiring material containing Nd disclosed in Japanese Patent Application Laid-Open No. 2004-214606, there is a tendency that precipitate segregates in the wiring circuit layer due to heat treatment performed when the element is formed (see FIG. 5).

When the precipitate thus segregates in the wiring circuit layer, there is a concern for unsatisfactory bonding characteristic in the direct bonding depending on the bonding position on the wiring circuit layer. That is, intermetallic compounds that are precipitated in the wiring circuit layer affect bonding resistance and the like in the direct bonding, so that the bonding characteristic when a transparent electrode layer or a semiconductor layer is directly bonded to the portion where segregation occurs in the wiring circuit layer will differ from the bonding characteristic when the transparent electrode layer or the semiconductor layer is directly bonded to the portion where no segregation occurs. In some cases, when a thin film obtained by depositing the Al-based alloy wiring material is etched to form a wiring circuit, the difference in the etching rate between the portion where segregation occurs and the portion where no segregation occurs may not allow formation of an appropriately shaped wiring circuit.

On the other hand, in the wiring circuit layer made of the Al—Ni—B alloy wiring material according to the present invention, Ni compounds are dispersedly precipitated when the element is formed and the abundance rate of the Ni compounds on a line perpendicular to the thickness direction of the wiring circuit layer in a cross section of the wiring circuit layer ranges from 25% to 45% in the thickness direction of the wiring circuit layer. That is, the Ni compounds do not tend to segregate across the thickness of the wiring circuit layer (see FIG. 6). Thus, unlike the Al—Ni—Nd alloy wiring material described above, it is not necessary to specify the location where the transparent electrode layer or the semiconductor layer is directly bonded, and a wiring circuit having an appropriate circuit shape can be reliably formed by etching.

Most of the Ni compounds dispersedly precipitated in the wiring circuit layer made of the Al—Ni—B alloy wiring material according to the present invention is an $Al_3Ni$-phase intermetallic compound. The present inventors have investigated the Ni compound by observing the surface of the wiring circuit under a scanning electron microscope (SEM) and confirmed that the diameter of the Ni compound ranges from 20 nm to 160 nm and the average particle diameter ranges from 80 nm to 140 nm in each field of view. The ratio of the Ni compound area to the observational field of view was 5 to 20%, and the density of the Ni compound was 1000 particles/100 $\mu m^2$ to 5000 particles/100 $\mu m^2$. Furthermore, when a cross section of the wiring circuit layer was observed under a transmission electron microscope (TEM), the size of the Ni compound was 10% to 80% of the thickness of the wiring circuit layer, which was 200 nm, and the Ni compounds were 10 nm to 150 nm apart.

When the Al—Ni—B alloy wiring material according to the present invention described above is used to manufacture the element of the display device, it is preferable to use a sputtering target composed such that the nickel content X at %, which is the nickel atomic percent, and the boron content Y at %, which is the boron atomic percent, are within the range that satisfies the above equations (1) to (4) and the remaining part is made of aluminum. In particular, within the range that satisfies the above equations (1) to (4), a puttering target composed such that the nickel content is 4.0 at % to 6.0 at % and the boron content is 0.20 at % to 0.80 at % can easily achieve a wring circuit extremely suitable for direct bonding to the semiconductor layer. When the thus composed sputtering target is used, an Al—Ni—B alloy thin film having the substantially same composition as that of the target can be easily formed, although it depends on the sputtering deposition condition to some extent.

Although the Al—Ni—B alloy wiring material according to the present invention is desirably deposited by sputtering as described above from a practical point of view, other different methods may be employed. For example, a dry process, such as evaporation and spray forming, may be used. Examples of the dry process include using alloy particles having the Al—Ni—B alloy composition according to the present invention as the wiring material in an aerosol deposition or ink jet method to form a wiring circuit.

BRIEF DESCRIPTION OF THE DRAWINGS

FIG. 1 is a schematic cross-sectional view of a TFT;

FIG. 2 is an optical micrograph showing the evaluation of Si diffusion resistance to heat;

FIG. 3 is an optical micrograph showing the evaluation of Si diffusion resistance to heat;

BEST MODE FOR CARRYING OUT THE INVENTION

Figure 4:
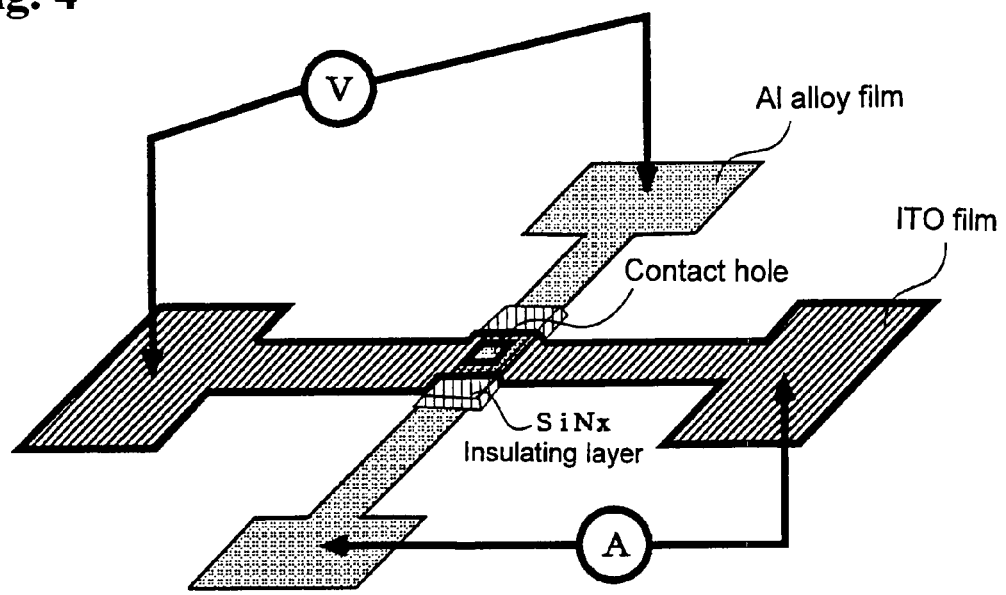
FIG. 4 is a schematic perspective view showing a test sample in which an ITO (IZO) electrode layer and an Al alloy electrode layer are laminated such that they intersect with each other.

The best mode for carrying out the present invention will be described below.

First Embodiment

In this embodiment, Al—Ni—B alloy wiring material having the composition described in each of the Examples and Comparison Examples shown in Table 1 was sputtered to form a film and the characteristics of the film were evaluated. The sputtering targets used in this embodiment were manufactured by mixing the metals in respective compositions described in Table 1 with aluminum, melting and stirring the mixture in a vacuum, casting the melted material in an atmosphere of inert gas, rolling and forming the resultant ingot, and machining the surface to be used in sputtering into a flat surface. The evaluated characteristics of each of the films composed as described in Table 1 were Si diffusion resistance to heat when directly bonded to a semiconductor layer, specific resistance of the film, 350° C. heat resistance of the film, ITO bondability and IZO bondability when directly bonded to a transparent electrode layer. The results are shown in Table 1 and Table 2.

TABLE 1

| | Composition at % | Specific resistance μΩ-cm |
|---|---|---|
| Example 1 | Al—3.0Ni—0.50B | 4.13 |
| Example 2 | Al—3.0Ni—0.68B | 4.18 |
| Example 3 | Al—4.7Ni—0.13B | 4.16 |
| Example 4 | Al—4.7Ni—0.50B | 4.35 |
| Example 5 | Al—4.7Ni—0.68B | 4.41 |
| Example 6 | Al—4.7Ni—0.86B | 4.62 |
| Example 7 | Al—4.7Ni—1.02B | 4.64 |
| Example 8 | Al—4.7Ni—1.46B | 4.96 |
| Example 9 | Al—1.0Ni—1.00B | 3.94 |
| Example 10 | Al—1.0Ni—5.00B | 7.05 |
| Example 11 | Al—1.0Ni—9.00B | 9.86 |
| Example 12 | Al—5.0Ni—3.00B | 6.63 |
| Example 13 | Al—5.0Ni—5.00B | 8.19 |
| Example 14 | Al—8.0Ni—2.00B | 8.05 |
| Comparison Example 1 | Al | 3.01 |
| Comparison Example 2 | Al—0.3C | 3.32 |
| Comparison Example 3 | Al—0.2Si | 3.15 |

TABLE 1-continued

| | Composition at % | Specific resistance μΩ-cm |
|---|---|---|
| Comparison Example 4 | Al—3.0Ni | 3.70 |
| Comparison Example 5 | Al—4.8Ni | 4.12 |
| Comparison Example 6 | Al—11.0Ni | 10.60 |
| Comparison Example 7 | Al—0.3Ni—5.00B | 3.58 |
| Comparison Example 8 | Al—1.0Ni—0.50B | 3.55 |
| Comparison Example 9 | Al—1.0Ni—12.00B | 12.50 |
| Comparison Example 10 | Al—5.0Ni—0.01B | 4.03 |
| Comparison Example 11 | Al—5.0Ni—6.00B | 10.20 |
| Comparison Example 12 | Al—8.0Ni—3.00B | 10.40 |
| Comparison Example 13 | Al—0.2Si—0.68B | 3.48 |
| Comparison Example 14 | Al—3.0Ni—0.30C | 3.76 |
| Comparison Example 15 | Al—3.0Ni—0.30C—0.2Si | 3.84 |

TABLE 2

| | Si diffusion heat resistance ° C. | 350° C. heat resistance | ITO bondability | IZO bondability |
|---|---|---|---|---|
| Example 1 | 240 | A | A | A |
| Example 2 | 240 | A | A | A |
| Example 3 | 300 | A | A | A |
| Example 4 | 330 | A | A | A |
| Example 5 | 330 | A | A | A |
| Example 6 | 330 | A | A | A |
| Example 7 | 330 | A | A | A |
| Example 8 | 330 | A | A | A |
| Example 9 | 240 | A | A | A |
| Example 10 | 260 | A | A | A |
| Example 11 | 300 | A | A | A |
| Example 12 | 330 | A | A | A |
| Example 13 | 330 | A | A | A |
| Example 14 | 330 | A | A | A |
| Comparison Example 1 | 170 | C | C | C |
| Comparison Example 2 | 170 | C | C | C |
| Comparison Example 3 | 180 | C | C | C |
| Comparison Example 4 | 200 | C | A | A |
| Comparison Example 5 | 250 | C | A | A |
| Comparison Example 6 | 300 | C | A | A |
| Comparison Example 7 | 230 | C | C | C |
| Comparison Example 8 | 200 | C | A | A |
| Comparison Example 9 | 330 | A | A | A |
| Comparison Example 10 | 190 | C | A | A |
| Comparison Example 11 | 330 | A | A | A |
| Comparison Example 12 | 330 | A | A | A |
| Comparison Example 13 | 180 | C | C | C |
| Comparison Example 14 | 200 | C | A | A |
| Comparison Example 15 | 220 | C | A | A |

The measurement condition of each characteristic evaluation will be described below.

The Si diffusion resistance to heat: As a sample used for evaluating this characteristic, an n$^+$-Si semiconductor layer (300 Å) was formed on a glass substrate using CVD, and on the semiconductor layer was formed a film (2000 Å) having each composition shown in Table 1 using sputtering (a magnetron sputtering apparatus, an input power of 3.0 Watt/cm$^2$, an argon gas flow rate of 100 sccm and an argon gas pressure of 0.5 Pa). Then, the evaluation samples underwent heat treatment set at temperatures ranging from 150 to 350° C. in 10° C. steps for 30 minutes in an atmosphere of nitrogen gas. Thereafter, the evaluation samples were immersed in a phosphoric acid-based Al etching solution (KANTO CHEMICAL Co., Inc., Al mixed-acid etchant having a solution temperature of 32° C. and a composition (by volume) of phosphoric acid:oxalic acid: acetic acid: water=16:1:2:1) for 10 minutes to dissolve only the films having the respective compositions formed as the top layer such that the semiconductor layer was exposed. The exposed surface of the semiconductor layer was observed under an optical microscope (at 200×) to check if Si and Al had interdiffused.

FIGS. 2 and 3 are representative optical micrographs showing exposed semiconductor layer surfaces. FIG. 2 shows a semiconductor layer surface on which no interdiffusion is observed, while FIG. 3 shows a semiconductor layer surface on which interdiffusion traces (black dots in the micrograph) are observed. The Si diffusion resistance to heat was determined such that a sample on which black dots shown in FIG. 3 were observed was judged as defective, and among the samples on which no interdiffusion was observed as shown in FIG. 2, the highest heat treatment temperature was recorded in Table 2 as an index value for evaluating the Si diffusion resistance to heat.

Specific resistance of film: The specific resistance value of the film having each composition described in Table 1 was measured using a four-terminal resistance measuring apparatus after forming the single film (about 0.3 μm thick) on a glass substrate using sputtering (under the same condition as that described above) and performing heat treatment at 300° C. for 30 minutes in an atmosphere of nitrogen gas.

350° C. Heat resistance: The heat resistance of the film having each composition described in Table 1 was determined by observing the film surface under a scanning electron microscope (SEM: 10,000×) after forming the single film (about 0.3 μm thick) on a glass substrate using sputtering (under the same condition as that described above) and performing heat treatment at 100° C. to 400° C. for 30 minutes in an atmosphere of nitrogen gas. In the SEM observation, five fields of view in each observed sample were checked, each field of view having a size of 10 μm by 8 μm. The 350° C. heat resistance was evaluated such that after the heat treatment at 350° C. for 30 minutes, a sample that was determined to have projections (hillocks) with a diameter of 0.1 μm or larger on the observed surface or a sample that was determined to have four or more dished dimples (0.3 μm to 0.5 μm in diameter) on the observed surface is judged as C. A sample having no projection and having three dimples or fewer is judged as A.

ITO bondability: The ITO bondability was evaluated using a test sample (Kelvin element) obtained such that an ITO ($In_2O_3$-10 wt % $SnO_2$) electrode layer (having a thickness of 1000 Å and a circuit width of 10 μm) was formed on a glass substrate, as shown in the schematic perspective view of FIG. 4, and a film layer having each composition (having a thickness of 2000 Å and a circuit width of 10 μm) was formed on the ITO electrode layer such that the film layer intersected the ITO electrode layer.

In manufacturing the test sample, firstly, an Al-based alloy target having each composition was used to form an Al-based alloy film having a thickness of 2000 Å on the glass substrate under the sputtering condition described above. The temperature of the substrate during the sputtering was set as shown in Table 6 for film deposition. Then, a resist (OFPR800: TOKYO OHKA KOGYO CO., LTD.) was coated on each of the Al-based alloy film surfaces, and a pattern film for forming a 10 μm-width circuit was placed on the resist, followed by exposure to light and development using an alkali developing solution containing tetramethylammonium hydroxide (hereinafter abbreviated to TMAH developing solution) having a concentration of 2.38% and a solution temperature of 23° C. Upon development, phosphoric acid-based mixed acid etching solution (KANTO CHEMICAL Co., Inc.) was used to form the circuit. Then, dimethyl sulfoxide (hereinafter abbreviated to DMSO) stripping solution was used to remove the resist so as to form the 10 μm-width Al-based alloy film circuit.

Thereafter, the substrate on which the 10 μm-width Al-based alloy film circuit was formed underwent pure water cleaning and drying, and a SiNx insulating layer (4200 Å in thick) was formed on the surface of the substrate. The deposition of this insulating layer was performed by using a sputtering apparatus under the sputtering condition of an input power RF of 3.0 Watt/cm$^2$, an argon gas flow rate of 90 sccm, a nitrogen gas flow rate of 10 sccm, a pressure of 0.5 Pa and a substrate temperature of 300° C.

Then, a positive resist (TFR-970: TOKYO OHKA KOGYO CO., LTD.) was coated on the surface of the insulating layer, and a pattern film for forming a 10 μm by 10 μm square contact hole was placed on the positive resist, followed by exposure to light and development using the TMAH developing solution. Then, $CF_4$ dry etching gas was used to form the contact hole. The contact hole was formed under the condition of a $CF_4$ gas flow rate of 50 sccm, an oxygen gas flow rate of 5 sccm, a pressure of 4.0 Pa and an output of 150 W.

The DMSO stripping solution described above was used to strip the resist. Then, isopropyl alcohol was used to remove the residual stripping solution, followed by water cleaning and drying. On each sample that underwent the resist stripping process, an ITO target (having a composition of $In_2O_3$-10 wt % $SnO_2$) was used to form an ITO transparent electrode layer in the contact hole and thereabout. The formation of the transparent electrode layer was performed by sputtering (a substrate temperature of 70° C., an input power of 1.8 Watt/cm$^2$, an argon gas flow rate of 80 sccm, an oxygen gas flow rate of 0.7 sccm and a pressure of 0.37 Pa), and then the 1000 Å-thick ITO film was formed.

A resist (OFPR800: TOKYO OHKA KOGYO CO., LTD.) was coated on the ITO film surface, and the pattern film was placed on the resist, followed by exposure to light, development using the TMAH developing solution and formation of the 10 μm-width circuit using an oxalic acid-based mixed acid etching solution (IT005N: KANTO CHEMICAL Co., Inc.). Upon the formation of the ITO film circuit, the DMSO stripping solution was used to remove the resist.

Each of the test samples obtained by using the preparation method described above underwent heat treatment at 250° C. for 30 minutes in the atmosphere, and a current (3 mA) was continuously applied to the terminals of the test sample indicated by the arrows in FIG. 4 to measure the resistance. The resistance was measured at 85° C. in the atmosphere, which was the so-called accelerated life testing condition. Under this accelerated life testing condition, the period of time (failure time) taken for each test sample to show resistance 100 times or greater than the initial resistance at the start of the measurement was recorded. A test sample that did not fail after 250 hours under the accelerated life testing condition was evaluated as A. A test sample that failed within 250 hours under the accelerated life testing condition was evaluated as C. The accelerated life test described above is in accordance with JIS C 5003: 1974 and a reference document ("Efficient Way and Actual practice of Reliability Acceleration Tests", author and editor: Yoji Kanuma, J-TECHNO INC.).

IZO bondability: The IZO bondability was evaluated, as in the above ITO bondability evaluation, using a test sample (Kelvin element) obtained such that each Al-based alloy film layer (having a thickness of 2000 Å and a circuit width of 50 μm) was formed on an intersecting IZO ($In_2O_3$-10.7 wt % ZnO: having a thickness of 1000 Å and a circuit width of 50 μm) electrode layer. The test samples were prepared under the condition similar to that used in the ITO bondability evaluation. The resistance of these test samples was measured under the accelerated life testing condition similar to that used in the ITO bondability evaluation, and the accelerated life test results were used to evaluate the IZO bondability. The evaluation reference was also similar to that used in the ITO bondability evaluation.

As shown in Table 1, the Al—Ni—B alloy wiring material of each Example according to the present invention showed a specific resistance value of 10 µΩ-cm or smaller, while Comparison Examples 9, 11 and 12, where the composition did not satisfy that defined in the present invention, showed a specific resistance value greater than 10 µΩ-cm. As shown in Table 2, the Al—Ni—B alloy wiring material of each Example showed Si diffusion resistance to heat of 240° C. or higher and some of them did not show interdiffusion of Al and Si across the bonded interface even at a high temperature of 330° C. As shown in Table 2, it was confirmed that the transparent electrode layers made of ITO and IZO could be directly bonded to the Al—Ni—B alloy wiring material of each Example. Regarding the Si diffusion resistance to heat, it is practically desirable that no altered layer will be generated due to heat treatment at 200° C. or higher, more desirably at higher temperatures of 240° C. to 300° C., considering of a heat history applied when an insulating film is formed by CVD. Furthermore, to provide a margin of applicability of a manufacturing condition in which thermal histories are applied in the element manufacturing process, it is desirable that Si will not diffuse at 330° C. or higher.

On the other hand, in Comparison Examples 1 to 3, it was confirmed that all characteristics other than the specific resistance were not satisfactory for practical use. In Comparison Examples 4 and 5 where Al—Ni alloys were used, although the bonding characteristics of the Al—Ni alloys to the transparent electrode layer were satisfactory, the heat resistance and Si diffusion resistance to heat was not sufficient. In particular, in Comparison Example 6 where the Ni content was high, film specific resistance was greater than 10 µΩ-cm. In Comparison Examples 7 to 12 where each composition did not satisfy that defined in the present invention, the film characteristics were not satisfactory, considering various factors together, that is, unsatisfactory direct bonding to ITO (Comparison Example 7), Si diffusion resistance to heat of 200° C. or lower (Comparison Examples 8 and 10) and specific resistance value greater than 10 µΩ-cm (Comparison Examples 9, 11 and 12). In Comparison Example 13 where silicon (Si) was contained in place of nickel, the bondability of the material to the transparent electrode layer as well as Si diffusion resistance to heat was not satisfactory. In the conventional Al—Ni—C alloy wiring material proposed by the applicant (Comparison Examples 14 and 15), it was confirmed that the bondability of the material to the transparent electrode layer was satisfactory, but heat resistance and Si diffusion resistance to heat was not sufficient.

Second Embodiment

In Second Embodiment, a description will be made of the results of more detailed investigation on the relationship of the heat resistance of the film and the bonding characteristic of the film to the semiconductor layer with the composition range of the Al—Ni—B alloy wiring material according to the present invention. Tables 3 to 5 show the results of the investigation on how the change in the nickel content and the boron content changes the specific resistance value of the film and the dimple occurrence rate of the film, the occurrence of the altered layer and the surface roughness of the semiconductor layer when the film is directly bonded to the semiconductor layer.

TABLE 3

| Composition at % | | Specific resistance | Dimple occurrence rate % | |
|---|---|---|---|---|
| Ni | B | µΩ-cm | 350° C. | 400° C. |
| 3.0 | 0.30 | 4.07 | 1.61 | 2.03 |
| 3.0 | 0.40 | 4.11 | 1.63 | 1.63 |
| 3.0 | 0.50 | 4.13 | 1.70 | 1.67 |
| 3.0 | 0.60 | 4.18 | 1.67 | 2.11 |
| 3.0 | 0.80 | 4.22 | 1.75 | 3.55 |
| 3.0 | 1.00 | 4.28 | 1.71 | 4.15 |
| 3.0 | 1.80 | 4.35 | 1.87 | 4.97 |
| 4.0 | 0.05 | 3.85 | 1.21 | 1.72 |
| 4.0 | 0.10 | 3.92 | 1.20 | 1.65 |
| 4.0 | 0.20 | 4.01 | 1.22 | 1.97 |
| 4.0 | 0.30 | 4.06 | 1.24 | 1.57 |
| 4.0 | 0.40 | 4.22 | 1.21 | 1.60 |
| 4.0 | 0.50 | 4.41 | 1.32 | 1.60 |
| 4.0 | 0.60 | 4.31 | 1.30 | 1.63 |
| 4.0 | 0.80 | 4.50 | 1.60 | 1.80 |
| 4.0 | 1.00 | 4.52 | 1.73 | 1.90 |
| 5.0 | 0.05 | 4.03 | 0.53 | 1.42 |
| 5.0 | 0.10 | 4.07 | 0.57 | 1.60 |
| 5.0 | 0.20 | 4.53 | 0.67 | 1.62 |
| 5.0 | 0.30 | 4.50 | 1.27 | 1.50 |
| 5.0 | 0.40 | 4.55 | 1.52 | 1.73 |
| 5.0 | 0.50 | 4.58 | 1.56 | 1.79 |
| 5.0 | 0.60 | 4.62 | 1.50 | 1.73 |
| 5.0 | 0.80 | 4.67 | 1.60 | 1.85 |
| 5.0 | 1.00 | 4.73 | 1.72 | 1.94 |
| 6.0 | 0.05 | 4.30 | 0.60 | 1.32 |
| 6.0 | 0.10 | 4.38 | 0.63 | 1.42 |
| 6.0 | 0.20 | 4.52 | 0.67 | 1.48 |
| 6.0 | 0.30 | 4.65 | 0.77 | 1.20 |
| 6.0 | 0.40 | 4.67 | 0.80 | 1.15 |
| 6.0 | 0.50 | 4.69 | 0.80 | 1.23 |
| 6.0 | 0.60 | 4.74 | 0.98 | 1.33 |
| 6.0 | 0.80 | 4.98 | 1.42 | 1.65 |
| 6.0 | 1.00 | 5.05 | 1.70 | 1.88 |
| 7.0 | 0.30 | 5.19 | 0.87 | 1.23 |
| 8.0 | 0.50 | 5.50 | 1.22 | 1.57 |
| 8.0 | 1.00 | 5.70 | 1.75 | 1.95 |

TABLE 4

| Composition at % | | Altered layer | | |
|---|---|---|---|---|
| Ni | B | 300° C. | 330° C. | 350° C. |
| 3.0 | 0.30 | B | B | C |
| 3.0 | 0.40 | B | B | C |
| 3.0 | 0.50 | B | B | C |
| 3.0 | 0.60 | B | B | C |
| 3.0 | 0.80 | A | B | C |
| 3.0 | 1.00 | A | B | C |
| 3.0 | 1.80 | A | A | B |
| 4.0 | 0.05 | A | B | B |
| 4.0 | 0.10 | A | B | B |
| 4.0 | 0.20 | A | A | B |
| 4.0 | 0.30 | A | A | B |
| 4.0 | 0.40 | A | A | A |
| 4.0 | 0.50 | A | A | B |
| 4.0 | 0.60 | A | A | B |
| 4.0 | 0.80 | A | A | B |
| 4.0 | 1.00 | A | A | B |
| 5.0 | 0.05 | A | B | B |
| 5.0 | 0.10 | A | A | B |
| 5.0 | 0.20 | A | A | B |
| 5.0 | 0.30 | A | A | A |
| 5.0 | 0.40 | A | A | A |
| 5.0 | 0.50 | A | A | A |

TABLE 4-continued

| Composition at % | | Altered layer | | |
|---|---|---|---|---|
| Ni | B | 300° C. | 330° C. | 350° C. |
| 5.0 | 0.60 | A | A | B |
| 5.0 | 0.80 | A | A | B |
| 5.0 | 1.00 | A | A | B |
| 6.0 | 0.05 | A | A | B |
| 6.0 | 0.10 | A | A | B |
| 6.0 | 0.20 | A | A | B |
| 6.0 | 0.30 | A | A | B |
| 6.0 | 0.40 | A | A | A |
| 6.0 | 0.50 | A | A | B |
| 6.0 | 0.60 | A | A | B |
| 6.0 | 0.80 | A | A | B |
| 6.0 | 1.00 | A | A | B |
| 7.0 | 0.30 | A | A | B |
| 8.0 | 0.50 | A | A | B |
| 8.0 | 1.00 | A | A | B |

TABLE 5

| Composition at % | | Amount of change in roughness | | |
|---|---|---|---|---|
| Ni | B | 300° C. | 330° C. | 350° C. |
| 3.0 | 0.30 | 1.59 | 1.99 | 3.52 |
| 3.0 | 0.40 | 2.21 | 2.11 | 3.05 |
| 3.0 | 0.50 | 2.33 | 2.15 | 2.45 |
| 3.0 | 0.60 | 2.14 | 1.92 | 2.32 |
| 3.0 | 0.80 | 1.88 | 1.95 | 2.06 |
| 3.0 | 1.00 | 1.65 | 1.76 | 1.82 |
| 3.0 | 1.80 | 1.30 | 1.44 | 1.58 |
| 4.0 | 0.05 | 1.55 | 1.72 | 1.85 |
| 4.0 | 0.10 | 1.29 | 1.49 | 1.72 |
| 4.0 | 0.20 | 1.13 | 1.43 | 1.48 |
| 4.0 | 0.30 | 1.41 | 1.46 | 1.88 |
| 4.0 | 0.40 | 1.15 | 1.36 | 1.46 |
| 4.0 | 0.50 | 1.30 | 1.47 | 1.58 |
| 4.0 | 0.60 | 1.12 | 1.24 | 1.32 |
| 4.0 | 0.80 | 1.11 | 1.22 | 1.28 |
| 4.0 | 1.00 | 1.02 | 1.10 | 1.20 |
| 5.0 | 0.05 | 1.14 | 0.98 | 1.58 |
| 5.0 | 0.10 | 1.12 | 1.02 | 1.32 |
| 5.0 | 0.20 | 1.01 | 1.10 | 1.38 |
| 5.0 | 0.30 | 1.03 | 1.08 | 1.35 |
| 5.0 | 0.40 | 1.14 | 0.92 | 1.20 |
| 5.0 | 0.50 | 1.37 | 1.42 | 1.50 |
| 5.0 | 0.60 | 1.04 | 0.99 | 0.96 |
| 5.0 | 0.80 | 1.01 | 1.01 | 1.06 |
| 5.0 | 1.00 | 0.99 | 0.97 | 1.12 |
| 6.0 | 0.05 | 1.02 | 0.95 | 1.03 |
| 6.0 | 0.10 | 1.00 | 1.08 | 1.08 |
| 6.0 | 0.20 | 1.05 | 0.98 | 0.94 |
| 6.0 | 0.30 | 1.06 | 0.91 | 0.92 |
| 6.0 | 0.40 | 0.95 | 0.93 | 1.02 |
| 6.0 | 0.50 | 1.30 | 1.20 | 0.92 |
| 6.0 | 0.60 | 0.94 | 0.93 | 1.18 |
| 6.0 | 0.80 | 0.91 | 1.03 | 1.04 |
| 6.0 | 1.00 | 0.95 | 0.95 | 1.10 |
| 7.0 | 0.30 | 1.06 | 1.12 | 1.11 |
| 8.0 | 0.50 | 1.02 | 0.92 | 1.08 |
| 8.0 | 1.00 | 0.91 | 0.96 | 1.04 |

Table 3 shows the specific resistance value and the dimple occurrence rate of the films having respective compositions. The specific resistance value of the film was measured under the condition similar to that used in First Embodiment. The results of the dimple occurrence rate were obtained by using the SEM to observe each evaluation sample obtained under the condition similar to that used in the heat resistance evaluation in the first embodiment but at heat treatment temperatures of 350° C. and 400° C. However, the dimple occurrence rate was checked in the heat resistance evaluation in the second embodiment in order to conduct more detailed investigation than in the heat resistance evaluation in First Embodiment. The dimple occurrence rate was defined by detecting dished dimples (0.3 to 0.5 μm in diameter) on the observed surface, calculating the dimple area from the size and the number of the dimples and determining the ratio of the dimple area to the observation area. The calculation of the dimple area was carried out by using image analysis to binarize the dished portions present on the observed surface and approximating each of the dished portions to a circle. The depth of some of the dimples was also measured to be about 100 Å. The values of the dimple occurrence rate shown in Table 3 were calculated by averaging the values obtained from five fields of view of 10 μm by 8 μm in each observed sample.

From the results of the specific resistance value shown in Table 3, it was found that when the nickel content is 6.0 at % or lower and the boron content is 0.80 at % or lower, the specific resistance value becomes 5 μΩ-cm or lower. As seen from the results of the dimple occurrence rate shown in Table 3, it was observed that the dimple occurrence rate tends to increase when the heat treatment temperature is higher and tends to decrease when the nickel content is higher. It was also observed that the dimple occurrence rate tends to increase as the boron content increases. From the results shown in Table 3, it was found that when the nickel content is 4.0 at % or higher and the boron content is 0.80 at % or lower, the dimple occurrence rate can be reduced to 1.6% or lower in the heat treatment at 350° C. for 30 minutes.

The result of the investigation on the occurrence of the altered layer at the bonded interface shown in Table 4 will be described below. The evaluation sample used in this investigation on the altered layer was prepared under the condition similar to that used in the evaluation of the Si diffusion resistance to heat described in First Embodiment. Specifically, the sample was obtained by forming an n$^+$-Si semiconductor layer (300 Å) on a glass substrate using CVD and forming an Al—Ni—B alloy film (2000 Å) having each composition shown in Table 4 on the semiconductor layer using sputtering (the magnetron sputtering apparatus, an input power of 3.0 Watt/cm$^2$, an argon gas flow rate of 100 sccm and an argon gas pressure of 0.5 Pa). Then, the evaluation samples underwent heat treatment at 300, 330 and 350° C. for 30 minutes in an atmosphere of nitrogen gas. Thereafter, the phosphoric acid-based Al etching solution was used to dissolve only the Al-based alloy film formed as the top layer such that the semiconductor layer was exposed. The exposed surface of the semiconductor layer was observed under the optical microscope (at 200×) to check the presence of the black-dotted altered portion shown in FIG. 3 or the state of the discolored or roughened surface of the semiconductor layer. In Table 4, a sample on which a large number of black dots due to the interdiffusion of Si and Al were detected was evaluated as C; a sample on which several black dots or fewer were detected or although no black dot was detected, discolored or roughened state of the observed surface was detected was evaluated as B; and a sample on which no black dot, discolored or roughened state was detected on the observed surface was evaluated as A.

Table 5 shows the results of the investigation on the change in the surface state of the semiconductor layer performed along with the investigation on the altered layer. The change in the surface state of the semiconductor layer was measured in terms of the surface roughness of the semiconductor layer. Specifically, the surface roughness immediately after the n$^+$-Si semiconductor layer (300 Å) was formed on the glass substrate (hereinafter referred to as as-depo roughness) and the surface roughness of the exposed semiconductor layer of the evaluation sample used in the investigation of the altered layer (hereinafter referred to as direct bonding roughness) was measured to calculate (the value of the direct bonding roughness)/(the value of the as-depo roughness). That is, the higher the value of the amount of change in roughness shown in Table 5 than 1, the more roughened surface state the semiconductor layer upon the direct bonding and the heat treatment has. The measurement of the surface roughness of the semiconductor layer was carried out by using a step/surface roughness (roughness)/small feature measuring apparatus (model P-15, KLA Tencor) to calculate the ten-point mean roughness Rz in accordance with JIS B0601:1994.

From the results shown in Table 4, a tendency was observed that higher nickel content could reduce the occurrence of the altered layer. It was also found that when the nickel content was 4.0 to 6.0 at % and the boron content was 0.20 to 0.80 at %, the occurrence of the altered layer was particularly suppressed in the heat treatment at 330° C. Furthermore, a tendency was observed that when the nickel content was 4.0 to 6.0 at % and the boron content was 0.30 to 0.50 at %, the altered layer was not generated even at a high temperature of 350° C.

It was found that the amount of change in roughness shown in Table 5 tends to correlate with the results of the dimple occurrence rate. From the results of the amount of change in roughness shown in Table 5, it was found that when the composition range was configured such that the nickel content was 4.0 to 6.0 at % and the boron content was 0.20 to 0.60 at %, the bonded surface of the semiconductor layer would not be significantly roughened even in the heat treatment at 330° C. upon the direct bonding, that is, the amount of change in roughness was within 1.5 times the as-depo roughness value.

Third Embodiment

In Third Embodiment, the results of investigation on roughness of the deposited surface using sputtering will be described. In the third embodiment, among the Al—Ni—B alloy wiring material according to the present invention, the investigation was conducted on the Al—Ni—B alloy film having a composition of Al-5.0 at % Ni-0.4 at % B (Example 15), as well as a pure Al film (referred to as Comparison Example 1 as in the first embodiment) and the Al-2.0 at % Nd alloy film (Comparison Example 16) for comparison purposes.

Firstly, the deposition condition for Example 15, Comparison Example 1 and Comparison Example 16 will be described. Al-based alloy targets having the respective compositions were used to form respective 2000 Å-thick alloy films on glass substrates (#1737, Corning Inc.) using a magnetron sputtering apparatus (multi-chamber type sputtering apparatus MSL464, Tokki Corporation) under the sputtering condition of an input power of 3.0 Watt/cm$^2$, an argon gas flow rate of 100 sccm and an argon gas pressure of 0.5 Pa. The temperatures of the substrates during the sputtering were set as shown in Table 6 for the film deposition.

Then, measurement of surface roughness Ra was carried out for each of the alloy films shown in Table 6. The surface roughness was measured by an atomic force microscope (SPI-3800N, Seiko Instruments Inc.) and calculated mean roughness Ra (JIS B0601-1982) was obtained. The measurement was made at five points on each alloy film surface to obtain the average value. The results are shown in Table 6. In Table 6, Examples 15-1 to 15-3 show the results for the Al-5.0 at % Ni-0.4 at % B alloy films deposited at substrate temperatures of 100° C. to 250° C. In Table 6, Comparison Example 17 shows the result for an Al-5.0 at % Ni-0.4 at % B alloy film deposited on a room temperature substrate, and Comparison Example 18 shows the result for an Al-5.0 at % Ni-0.4 at % B alloy film deposited at a substrate temperature of 300° C. Comparison Example 1 shows the result for the pure Al film and Comparison Example 16 shows the result for the Al-2.0 at % Nd alloy film. The average surface roughness value (Ra) of the glass substrates was 1.8 Å.

TABLE 6

| Film | Substrate temperature (° C.) | Surface roughness Ra (Å) |
|---|---|---|
| Comparison Example 17 | Room temperature | 1.8 |
| Example 15-1 | 100 | 2.5 |
| Example 15-2 | 200 | 10.5 |
| Example 15-3 | 250 | 19.3 |
| Comparison Example 18 | 300 | 25.3 |
| Comparison Example 1 | 100 | 40.4 |
| Comparison Example 16 | 100 | 22.0 |

From the results shown in Table 6, it was confirmed that the surface roughness of the Al—Ni—B alloy films varied with the substrate temperature. The pure Al film of Comparison Example 1 showed a significantly roughened surface, and the Al-2.0 at % Nd alloy film of Comparison Example 16 showed a roughened surface having surface roughness greater than Ra 20 Å even when the substrate temperature was about 100° C.

The results of investigation on the contact resistance and the bonding strength in the direct bonding to the transparent electrode layer will be described below. Firstly, the measurement of the contact resistance will be described. As described in the measurement of the surface roughness, the Al-based alloy targets having the respective compositions were used to form the 2000 Å-thick Al-based alloy films on the glass substrates under the sputtering condition described above. The temperatures of the substrates during the sputtering were set to those shown in Table 6 for the film deposition. Then, the resist (OFPR800: TOKYO OHKA KOGYO CO., LTD.) was coated on each of the Al-based alloy film surfaces, and a pattern film for forming a 20 μm-width circuit was placed on the resist, followed by exposure to light and development using the TMAH developing solution described in the first embodiment. Upon development, the phosphoric acid-based mixed acid etching solution described in the first embodiment was used to form the circuit. Then, the DMSO stripping solution was used to remove the resist so as to form the 20 μm-width Al-based alloy film circuit.

Thereafter, the substrate on which the 20 μm-width Al-based alloy film circuit was formed underwent pure water cleaning and drying, and a SiNx insulating layer (4200 Å in thick) was formed on the surface of the substrate. The deposition of this insulating layer was performed by using the sputtering apparatus under the sputtering condition of an input power RF of 3.0 Watt/cm$^2$, an argon gas flow rate of 90 sccm, a nitrogen gas flow rate of 10 sccm, a pressure of 0.5 Pa and a substrate temperature of 300° C.

Then, the positive resist (TFR-970: TOKYO OHKA KOGYO CO., LTD.) was coated on the surface of the insulating layer, and the pattern film for forming the 10 μm by 10 μm square contact hole was placed on the resist, followed by exposure to light and development using the TMAH developing solution. Then, the CF$_4$ dry etching gas was used to form the contact hole. The contact hole was formed under the condition of a CF$_4$ gas flow rate of 50 sccm, an oxygen gas flow rate of 5 sccm, a pressure of 4.0 Pa and an output of 150 W.

Thereafter, the DMSO stripping solution was used to strip the resist. Then, isopropyl alcohol was used to remove the residual stripping solution, followed by water cleaning and drying. On each sample that underwent the resist stripping process, the ITO target (having a composition of In$_2$O$_3$-10 wt % SnO$_2$) was used to form the ITO transparent electrode layer in the contact hole and therearound. The formation of the transparent electrode layer was performed by sputtering (a substrate temperature of 70° C., an input power of 1.8 Watt/cm$^2$, an argon gas flow rate of 80 sccm, an oxygen gas flow rate of 0.7 sccm and a pressure of 0.37 Pa), and then the 1000 Å-thick ITO film was formed.

The resist (OFPR800: TOKYO OHKA KOGYO CO., LTD.) was coated on the ITO film surface, and the pattern film was placed on the resist, followed by exposure to light, development using the TMAH developing solution and formation of the 20 μm-width circuit using the oxalic acid-based mixed acid etching solution (ITO05N: KANTO CHEMICAL Co., Inc.). Upon the formation of the ITO film circuit, the DMSO stripping solution was used to remove the resist.

The evaluation sample obtained by forming the contact hole and directly bonding the Al-based alloy film to the transparent electrode layer via the contact hole using the procedure described above was used to measure the contact resistance. The contact resistance was measured based on the four-terminal method shown in FIG. 4. The element in the evaluation sample was annealed at 250° C. for 30 minutes in the atmosphere and the resistance was measured for each evaluation sample. The measurement results of the contact resistance are shown in Table 7. The four-terminal method shown in FIG. 4 was performed by applying 100 μA to the terminals of the evaluation sample that underwent the heat treatment, so as to measure the resistance.

The measurement of the bonding strength in the direct bonding to the transparent electrode layer will now be described. The bonding strength was measured using the cross cut test in accordance with JIS C 5012. As in the measurement of the surface roughness, each Al-based alloy film (2000 Å) was first deposited on a glass substrate and an ITO film (1000 Å) was laminated on the Al-based alloy film. The deposition condition was similar to the sputtering condition.

A cutter was used to form cutting lines in a lattice pattern on the ITO film surface of each evaluation sample thus prepared such that forty square pieces having a size of 5 mm by 5 mm were obtained (four 5 mm by 5 mm squares along the vertical direction (20 mm) multiplied by ten 5 mm by 5 mm squares along the horizontal direction (50 mm)). An adhesive tape was attached on the surface of the ITO film and then the tape was peeled off. The state of the lattice pattern provided on the ITO film surface was visually checked after the tape was peeled off. Among the forty square pieces, the area where the film was peeled off was measured and the ratio of that area to the total area of the forty square pieces was calculated (peel-off ratio %) to evaluate the bonding strength of each evaluation sample. The peel-off ratio of 0 to 20% was evaluated as A; the peel-off ratio of 21 to 60% was evaluated as B; and the peel-off ratio of 61 to 100% was evaluated as C. The test results of the bonding strength are shown in Table 7.

TABLE 7

| Film | Bonding resistance (Ω) | Bonding strength |
| --- | --- | --- |
| Comparison Example 17 | 165 | C |
| Example 15-1 | 160 | B |
| Example 15-2 | 170 | A |
| Example 15-3 | 180 | A |
| Comparison Example 18 | 300 | A |
| Comparison Example 1 | 400 | A |
| Comparison Example 16 | 400 | A |

As seen from the results shown in Tables 6 and 7, when the surface roughness value of the Al-based alloy film increases, the contact resistance upon the formation of the element tends to increase. Conversely, the bonding strength tends to decrease when the roughness value decreases. From the above results, it was considered that the surface roughness of Ra 2.0 Å to 20 Å, more preferably 10 Å to 20 Å, ensures a contact resistance of 200Ω or lower and practical bonding strength.

Fourth Embodiment

In Fourth Embodiment, a description will be made of the results of investigation on the precipitate in the wiring circuit made of the Al—Ni—B alloy wiring material according to the present invention. The investigation on the precipitate in the wiring circuit was performed by analyzing the diffusion state of the precipitate.

Figure 5:
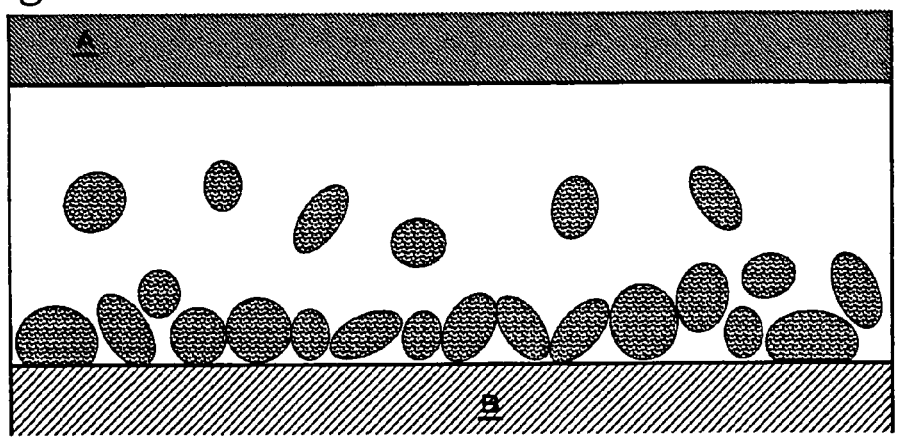
FIG. 5 is a schematic micrograph of Al-2.0 at % Ni-1.0 at % Nd alloy when observed under a TEM.
Figure 6:
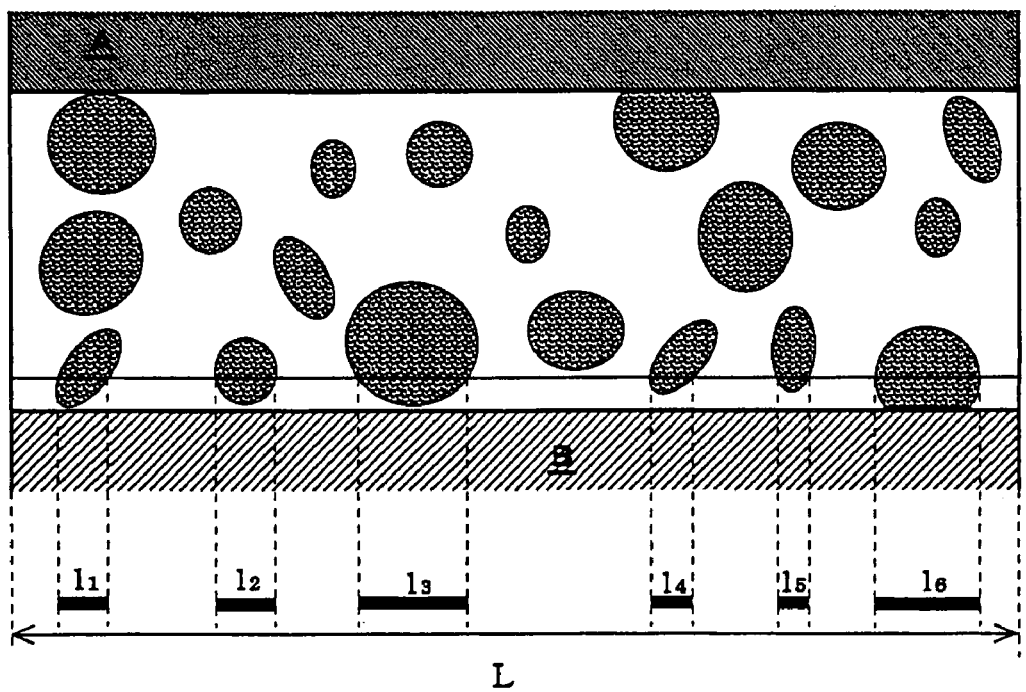
FIG. 6 is a schematic micrograph of Al-5.0 at % Ni-0.4 at % B alloy when observed under a TEM.

A description will now be made of how to prepare a sample for observing a cross section in Fourth Embodiment. The sample for observing a cross section was prepared by forming an 200 nm-thick Al-5.0 at % Ni-0.4 at % B alloy film, Al-2.0 at % Ni-1.0 at % Nd alloy film and Al-3.0 at % Ni alloy film on each glass substrate using sputtering, and depositing an ITO film on each of the alloy films, followed by heat treatment at 250° C. in the atmosphere. FIGS. 5 and 6 are schematic cross-sectional views showing the results of observation of a cross section of the wiring circuit layer (film) made of the Al-2.0 at % Ni-1.0 at % Nd alloy film and the Al-5.0 at % Ni-0.4 at % B alloy film using a transmission electron microscope (H-9000 TEM at 200,000x: Hitachi, Ltd.). Reference character A in FIGS. 5 and 6 indicates the ITO film and reference character B indicates the glass substrate.

A description will now be made how to evaluate the distribution of the precipitate from the TEM observation micrographs. The mid strip portion in FIG. 6 shows the wiring circuit layer, in which pieces of a Ni compound (Al—Ni-based intermetallic compound) are shown in a dispersed manner. The distribution of the Ni compound was obtained by measuring the total length $(l_1+l_2+l_3+l_4+l_5+l_6=\Sigma l)$ of a line perpendicular to the layer thickness direction that intersects the pieces of the Ni compound as shown in the schematic cross-sectional view, calculating the ratio (%) of the total length to the whole length of the line (L) and defining the ratio as the abundance ratio of the Ni compound. Furthermore, EDX analysis was used to identify the Ni compound and it was found that the Ni compound dispersedly precipitated in the wiring circuit layer made of the Al-5.0 at % Ni-0.4 at % B alloy wiring material was an Al$_3$Ni-phase intermetallic compound. In the case of the Al-2.0 at % Ni-1.0 at % Nd alloy wiring material, it was found that Al—Ni-based, Al—Nd-based, Al—Ni—Nd-based intermetallic compounds were precipitated. Furthermore, as shown in the schematic view of FIG. 5, in the case of the Al-2.0 at % Ni-1.0 at % Nd alloy, it was observed that a greater amount of the Al—Ni—Nd-based intermetallic compound segregated on the glass substrate side (reference character B) than other portions in the wiring circuit layer. On the other hand, in the case of the Al-5.0 at % Ni-0.4 at % B alloy, it was found that the pieces of the Al$_3$Ni-phase intermetallic compound, which was the precipitate in the wiring circuit layer, did not segregate but were uniformly dispersed.

Figure 7:
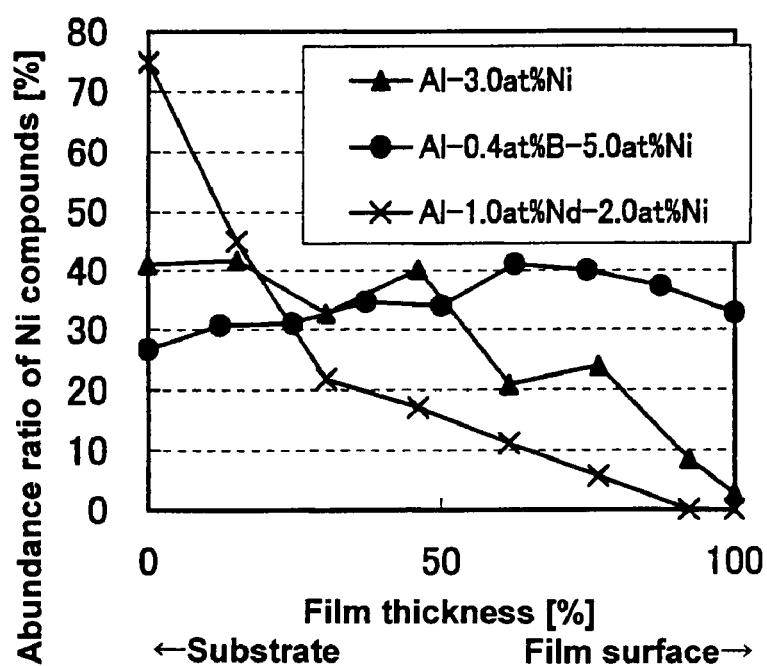
FIG. 7 shows measured graphs showing abundance rate of Ni compounds.

FIG. 7 shows the result of the investigation on the abundance ratio of the Ni compounds at predetermined thickness positions in the thickness direction of each of the wiring circuit layers. As shown in FIG. 7, in the case of the Al-2.0 at % Ni-1.0 at % Nd alloy, it was found that the abundance ratio of the Ni compound varied from 75% to 0% from the glass substrate side (B) to the ITO film surface side (A). Similarly, the investigation on the abundance ratio of the Ni compound in the Al-3.0 at % Ni alloy wiring material showed that the abundance ratio varied from 40% to 0% from the substrate side to the film surface side. On the other hand, in the case of the Al-5.0 at % Ni-0.4 at % B alloy wiring material according to the present invention, it was found that the abundance ratio of the Ni compound did not show significant numerical variance from the substrate side to the film surface side and fell within the range from about 25% to 45% and the pieces of the Ni compound did not segregate but were uniformly dispersed.

INDUSTRIAL APPLICABILITY

As described above, the present invention allows formation of a wiring circuit to which the transparent electrode layer made of ITO, IZO or the like as well as the semiconductor layer, such as n$^+$-Si, of the thin film transistor can be directly bonded without the cap layer made of refractory metal material, such as Mo. Particularly, in a thermal process at a temperature higher than 240° C., interdiffusion of Al and Si is suppressed at the bonded interface where the wiring circuit made of the Al—Ni—B alloy wiring material according to the present invention is directly bonded to the semiconductor layer.

Additionally, the Al—Ni—B alloy wiring material according to the present invention having significantly satisfactory heat resistance and low specific resistance of 10 μΩ-cm or lower is extremely suitable for constituent material of a display with an enlarged screen. Thus, the present invention provides a technology that allows cost reduction in all aspects in manufacturing a display device, such as a liquid crystal display, that is, material, equipment and processes, and achieves a display device having excellent characteristics.

The invention claimed is:

1. An Al—Ni—B alloy wiring material comprising aluminum, nickel and boron, wherein the nickel content X at %, the nickel atomic percent, and the boron content Y at %, the boron atomic percent, satisfy the following equations:

$0.5 \leq X \leq 10.0$ $0.05 \leq Y \leq 11.00$ $Y + 0.25X \geq 1.00$ $Y + 1.15X \leq 11.50$ and the remainder is aluminum, and wherein an Al$_3$Ni-phase intermetallic compound is precipitated in the wiring material.

2. The Al—Ni—B alloy wiring material according to claim 1, wherein the nickel content is 4.0 at % or higher and the boron content is 0.80 at % or lower.

3. The Al—Ni—B alloy wiring material according to claim 2, wherein a dimple occurrence rate on the surface of the wiring material after heat treatment at 350° C. for 30 minutes is 1.6% or lower.

4. The Al—Ni—B alloy wiring material according to claim 1, wherein the nickel content is 4.0 at % to 6.0 at % and the boron content is 0.20 at % to 0.80 at %.

5. The Al—Ni—B alloy wiring material according to claim 4, which has a specific resistance value is 5.0 μΩ-cm or lower.

6. An element structure of a display device comprising a wiring circuit layer made of the Al—Ni—B alloy wiring material, which wiring material being defined in claim 1, a semiconductor layer and a transparent electrode layer, wherein the wiring circuit layer has a portion that is directly bonded to the semiconductor layer.

7. An element structure of a display device comprising a wiring circuit layer made of the Al—Ni—B alloy wiring material, which wiring material being defined in claim 1, a semiconductor layer and a transparent electrode layer, wherein the wiring circuit layer has a portion tat is directly bonded to the transparent electrode layer.

8. An element structure of a display device comprising the element structure as defined in claim 6.

9. The element structure of a display device as defined in claim 6, wherein the value of surface roughness (Rz) of the semiconductor layer surface from which the directly bonded wiring circuit layer is stripped off is within 1.5 times the value of surface roughness (Rz) of the semiconductor layer surface upon formation thereof.

10. The element structure of a display device as defined in claim 6 wherein the surface roughness Ra of the Al—Ni—B alloy film made of the Al—Ni—B alloy wiring material that forms the wiring circuit layer to which the semiconductor layer and/or the transparent electrode layer is directly bonded is 2.0 A to 20.0 A.

11. An element structure of a display device in which a wiring circuit layer made of the Al—Ni—B alloy wiring material according to claim 1 is directly bonded to at least one of a semiconductor layer and a transparent electrode layer, wherein Al$_3$Ni is dispersedly precipitated in the wiring circuit layer, and the abundance rate of the Al$_3$Ni on a line perpendicular to the thickness direction of the wiring circuit layer in a cross section of the wiring circuit layer ranges from 25% to 45% in the thickness direction of the wiring circuit layer.

12. A sputtering target for forming a wiring circuit made of the Al—Ni—B alloy wiring material, which wiring material being defined in claim 1, wherein the nickel content X at %, the nickel atomic percent, and the boron content Y at %, the boron atomic percent. satisfy the following equations:

$0.5 \leq X \leq 10.0$ $0.05 \leq Y \leq 11.00$ $Y + 0.25X \geq 1.00$ $Y + 1.15X \leq 11.50$ and the remainder is aluminum.

13. The Al—Ni—B alloy wiring material according to claim 2, wherein the nickel content is 4.0 at % to 6.0 at % and the boron content is 0.20 at % to 0.80 at %.

14. The Al—Ni—B alloy wiring material according to claim 3, wherein the nickel content is 4.0 at % to 6.0 at % and the boron content is 0.20 at % to 0.80 at %.

15. The Al—Ni—B alloy wiring material according to claim 1, which has a specific resistance value is 5.0 μΩ-cm or lower.

16. The Al—Ni—B alloy wiring material according to claim 2, which has a specific resistance value is 5.0 μΩ-cm or lower.

17. The Al—Ni—B alloy wiring material according to claim 3, which has a specific resistance value is 5.0 μΩ-cm or lower.

18. An element structure of a display device comprising a wiring circuit layer made of the Al—Ni—B alloy wiring material, which wiring material being defined in claim 1, a semiconductor layer and a transparent electrode layer, wherein the wiring circuit layer has a portion that is directly bonded to the semiconductor layer.

19. An element structure of a display device comprising a wiring circuit layer made of the Al—Ni—B alloy wiring material, which wiring material being defined in claim 1, a semiconductor layer and a transparent electrode layer, wherein the wiring circuit layer has a portion that is directly bonded to the semiconductor layer.

20. An element structure of a display device comprising a wiring circuit layer made of the Al—Ni—B alloy wiring material, which wiring material being defined in claim 1, a semiconductor layer and a. transparent electrode layer, wherein the wiring circuit layer has a portion that is directly bonded to the semiconductor layer.

* * * * *

UNITED STATES PATENT AND TRADEMARK OFFICE
CERTIFICATE OF CORRECTION

PATENT NO.         : 7,531,904 B2
APPLICATION NO.    : 11/666300
DATED              : May 12, 2009
INVENTOR(S)        : Hironari Urabe, Yoshinori Matsuura and Takashi Kubota It is certified that error appears in the above-identified patent and that said Letters Patent is hereby corrected as shown below:

On the title page item [86]: change "PCT/JP2006/006676" to -- PCT/JP2006/306676 --.

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO.       : 7,531,904 B2
APPLICATION NO.  : 11/666300
DATED            : May 12, 2009
INVENTOR(S)      : Hironari Urabe, Yoshinori Matsuura and Takashi Kubota It is certified that error appears in the above-identified patent and that said Letters Patent is hereby corrected as shown below:

In claim 7, column 22, line 20, delete "tat" and substitute -- that --.

In claim 18, column 23, line 10, delete "1" and substitute -- 2 --.

In claim 19, column 24, line 3, delete "1" and substitute -- 3 --.

In claim 20, column 24, line 9, delete "1" and substitute -- 4 --.

Signed and Sealed this

Twenty-first Day of September, 2010

David J. Kappos
*Director of the United States Patent and Trademark Office*

UNITED STATES PATENT AND TRADEMARK OFFICE
CERTIFICATE OF CORRECTION

PATENT NO. : 7,531,904 B2
APPLICATION NO. : 11/666300
DATED : May 12, 2009
INVENTOR(S) : Hironari Urabe, Yoshinori Matsuura and Takashi Kubota It is certified that error appears in the above-identified patent and that said Letters Patent is hereby corrected as shown below:

In claim 7, column 22, line 20, delete "tat" and substitute -- that --.

In claim 18, column 23, line 10, delete "1" and substitute -- 2 --.

In claim 19, column 24, line 3, delete "1" and substitute -- 3 --.

In claim 20, column 24, line 9, delete "1" and substitute -- 4 --.

Signed and Sealed this

Fifth Day of October, 2010

David J. Kappos
*Director of the United States Patent and Trademark Office*